United States Patent
Lai et al.

(10) Patent No.: US 9,559,168 B2
(45) Date of Patent: Jan. 31, 2017

(54) FIELD EFFECT TRANSISTORS AND METHODS OF FORMING SAME

(71) Applicants: Taiwan Semiconductor Manufacturing Company, Ltd., Hsin-Chu (TW); National Taiwan University, Taipei (TW)

(72) Inventors: Der-Chuan Lai, Taipei (TW); Pin-Shiang Chen, Taipei (TW); Hung-Chih Chang, Taichung (TW); Chee-Wee Liu, Taipei (TW); Samuel C. Pan, Hsin-Chu (TW)

(73) Assignees: Taiwan Semiconductor Manufacturing Company, Ltd., Hsin-Chu (TW); National Taiwan University, Taipei (TW)

( * ) Notice: Subject to any disclaimer, the term of this patent is extended or adjusted under 35 U.S.C. 154(b) by 4 days.

(21) Appl. No.: 14/543,657

(22) Filed: Nov. 17, 2014

(65) Prior Publication Data

US 2016/0141366 A1 May 19, 2016

(51) Int. Cl.
*H01L 21/336* (2006.01)
*H01L 29/10* (2006.01)
*H01L 29/08* (2006.01)
*H01L 29/78* (2006.01)
*H01L 29/786* (2006.01)
*H01L 29/66* (2006.01)

(52) U.S. Cl.
CPC ....... *H01L 29/1033* (2013.01); *H01L 29/0847* (2013.01); *H01L 29/66484* (2013.01); *H01L 29/66742* (2013.01); *H01L 29/78391* (2014.09); *H01L 29/78645* (2013.01)

(58) Field of Classification Search
None
See application file for complete search history.

(56) References Cited

U.S. PATENT DOCUMENTS

| 7,476,930 B2 | 1/2009 | Allibert et al. | |
|---|---|---|---|
| 2014/0266324 A1* | 9/2014 | Teo | H01L 29/2003 327/109 |
| 2014/0353750 A1* | 12/2014 | Farmer | H01L 29/66477 257/347 |
| 2014/0355328 A1* | 12/2014 | Muller | G11C 11/2275 365/145 |

OTHER PUBLICATIONS

Fang, H., et al., "Degenerate n-Doping of Few-Layer Transition Metal Dichalcogenides by Potassium," Nano Lett., 2013, 13, published Apr. 9, 2013; pp. 1991-1995.

(Continued)

*Primary Examiner* — Calvin Choi
(74) *Attorney, Agent, or Firm* — Slater Matsil, LLP

(57) ABSTRACT

Semiconductor devices and methods of forming the same are provided. A first gate stack is formed over a substrate, wherein the first gate stack comprises a first ferroelectric layer. A source/channel/drain stack is formed over the first gate stack, wherein the source/channel/drain stack comprises one or more 2D material layers. A second gate stack is formed over the source/channel/drain stack, wherein the second gate stack comprises a second ferroelectric layer.

20 Claims, 12 Drawing Sheets

(56) References Cited

OTHER PUBLICATIONS

Khan, A.I., et al., "Ferroelectric Negative Capacitance MOSFET: Capacitance Tuning & Antiferroelectric Operation," IEEE International Electron Devices Meeting (IEDM), 2011, pp. 11.3.1-11.3.4.
Lee, Y.-H., et al., "Synthesis of Large-Area MoS2 Atomic Layers with Chemical Vapor Deposition," Advanced Materials 24, No. 17 (2012); pp. 2320-2325.

* cited by examiner

FIELD EFFECT TRANSISTORS AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-8A illustrate various cross-sectional views of a fabrication process of a semiconductor device in accordance with some embodiments.

DETAILED DESCRIPTION

Figure 1:
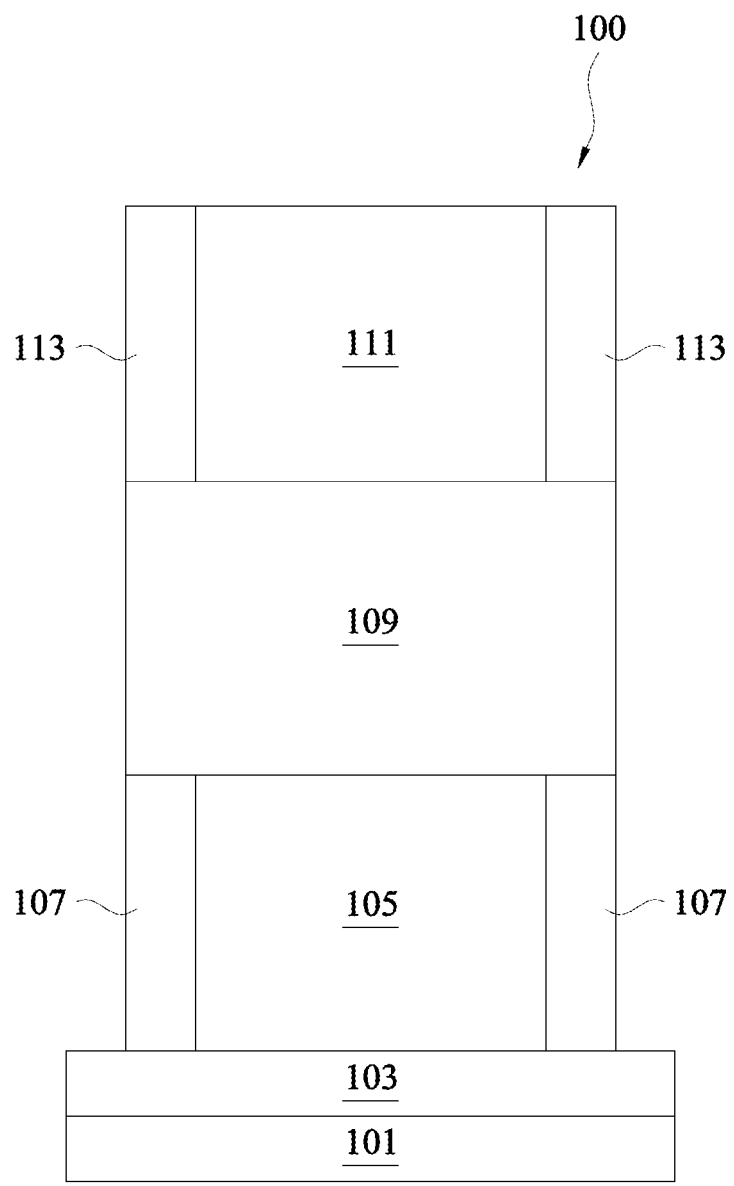
FIG. 1 illustrates a schematic cross-sectional view of a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A field effect transistor (FET) and the method of forming the same are provided in accordance with various exemplary embodiments. The intermediate stages of forming the FET are illustrated. The variations of the embodiments are discussed. Throughout the various views and illustrative embodiments, like reference numbers are used to designate like elements.

Embodiments such as those described herein provide a FET device with multiple channel regions formed in two dimensional (2D) material layers. Suitable 2D materials include one to a few monolayers (such as less than about 10 monolayers) of transition metal dichalcogenides (TMDCs), graphene (monolayer of graphite), and boron nitride (BN). Generally, 2D materials are monolayers of material held together by chemical bonds. Monolayers may be stacked upon each other to form a 2D material layer comprising individual monolayers. For example, individual monolayers of graphene, TMDCs, and/or BN may be stacked to create a 2D material layer.

The use of multiple layers of the 2D materials allows formation of devices having a much larger on current without increasing footprint. Additionally, the use of 2D materials allows for FET devices that provide improved gate control. Moreover, embodiments such as those described herein provide a FET device with multiple gate stacks for improved control of the FET device. In addition, each gate stack includes a layer of ferroelectric material having negative capacitance. The use of ferroelectric materials with negative capacitance allows formation of FET devices having lower subthreshold swing (SS) compared to conventional FET devices. The SS represents the easiness of switching the transistor current off and on, and is a factor in determining the switching speed of a FET device. Therefore, low SS allows for FET devices having higher switching speed compared to conventional FET devices.

FIG. 1 illustrates a schematic cross-sectional view of a semiconductor device 100 in accordance with some embodiments. In the illustrated embodiment, the semiconductor device 100 comprises a substrate 101, a first dielectric layer 103 on the substrate 101, a first gate stack 105 on the first dielectric layer 103, a source/channel/drain stack 109 on the first gate stack 105, and a second gate stack 111 on the source/channel/drain stack 109. Referring further to FIG. 1, the semiconductor device 100 further comprises first spacers 107 along sidewalls of the first gate stack 105, and second spacers 113 along sidewalls of the second gate stack 111. Throughout the description, the first gate stack 105 and the second gate stack 111 may also be referred as a back gate stack 105 and a top gate stack 111.

Figure 2:
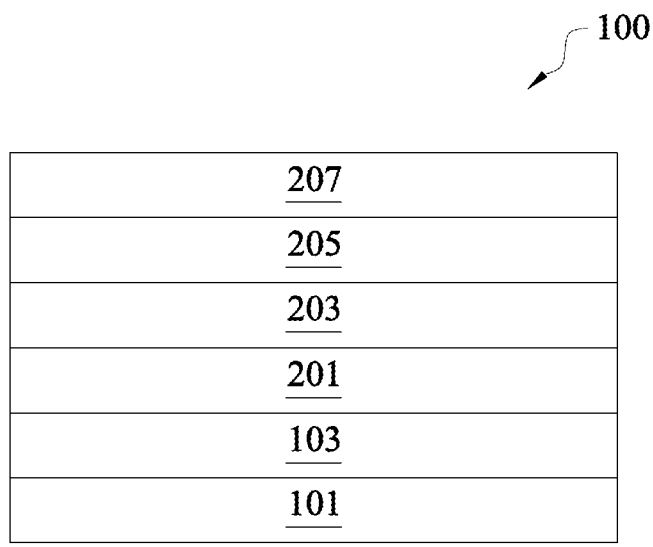
Figure 3:
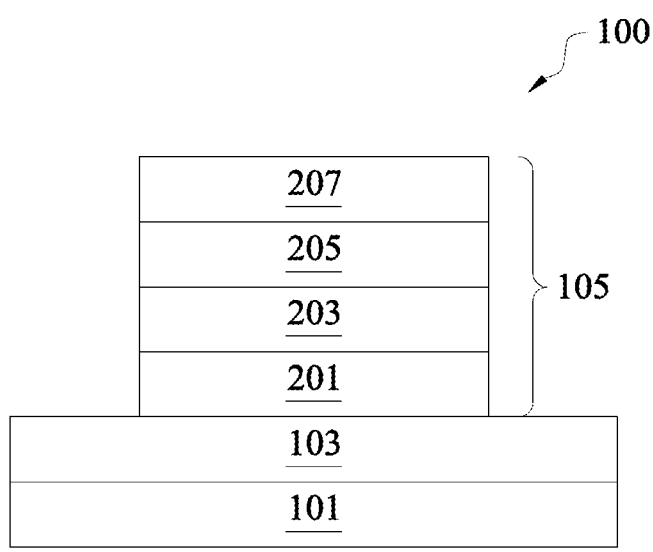
Figure 4:
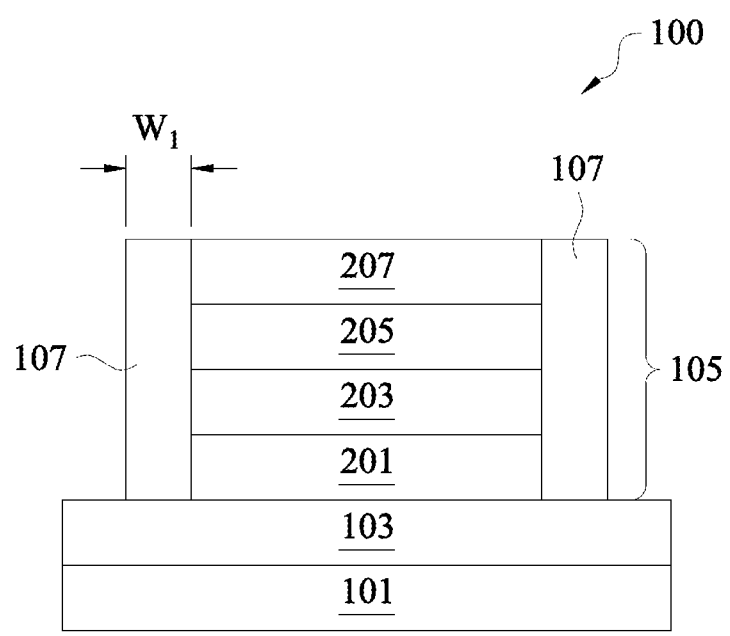
Figure 5:
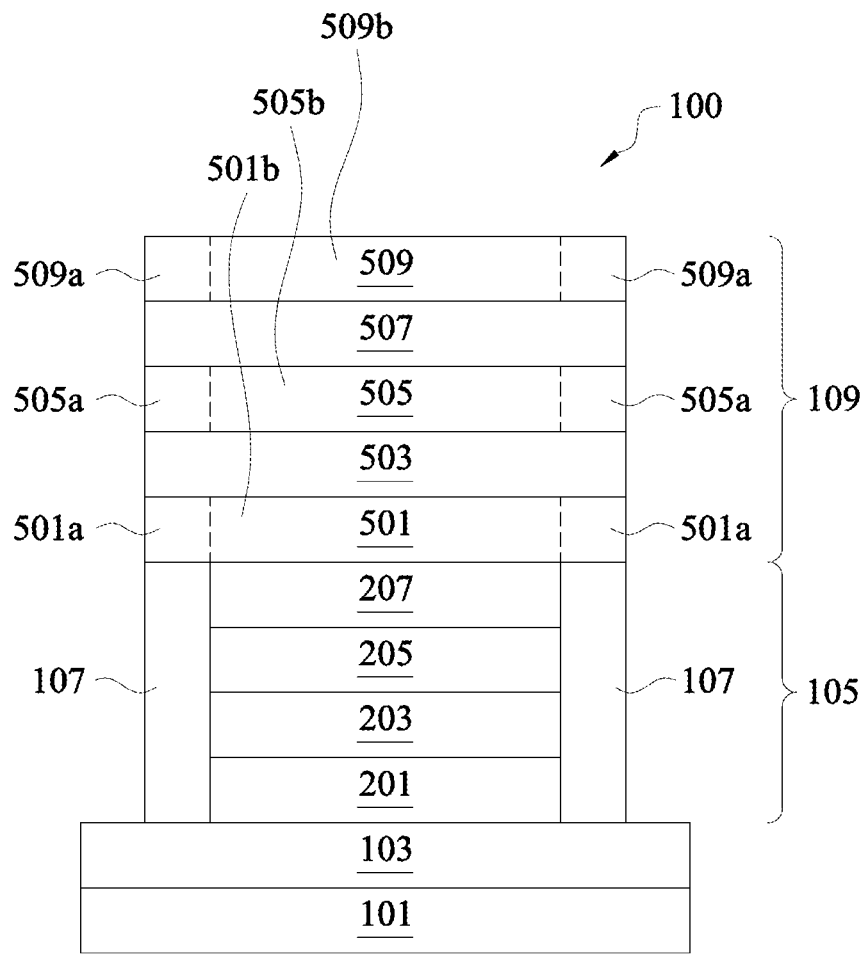
Figure 6:
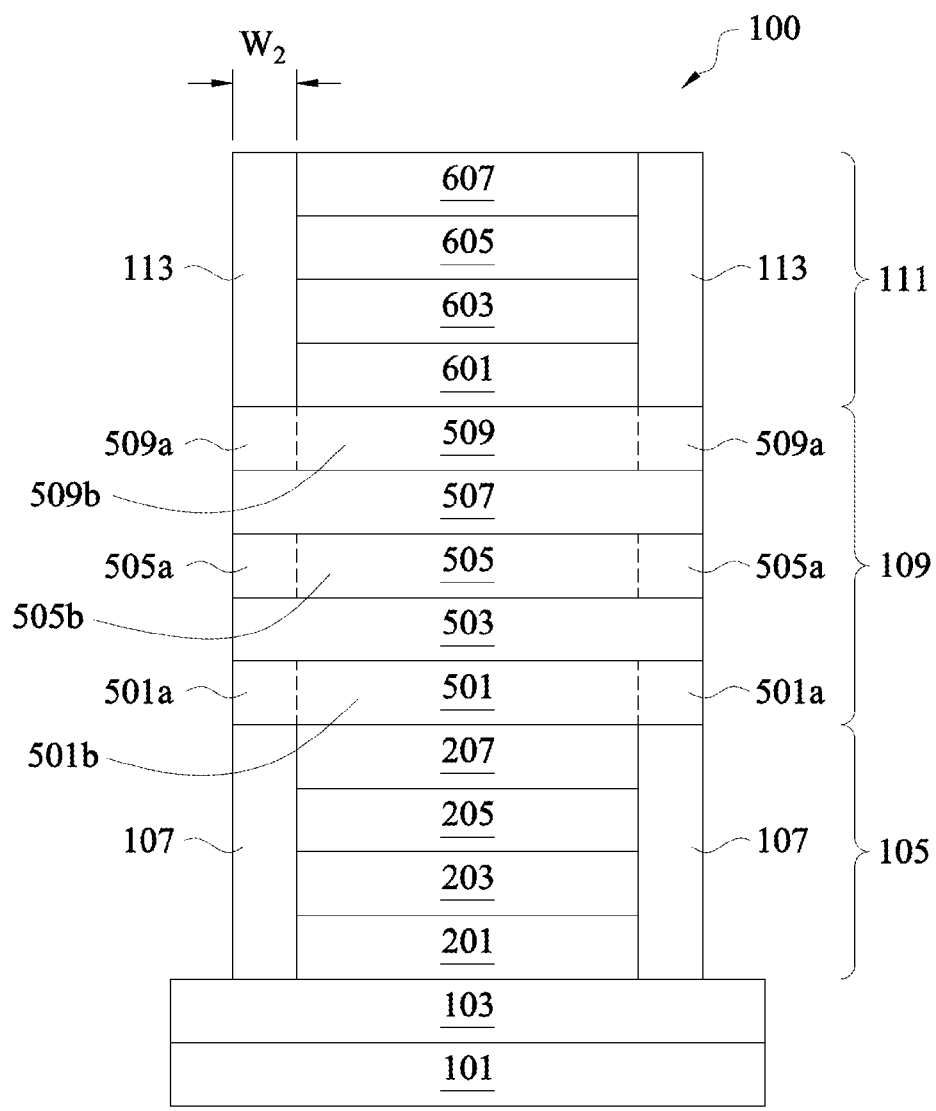
Figure 7:
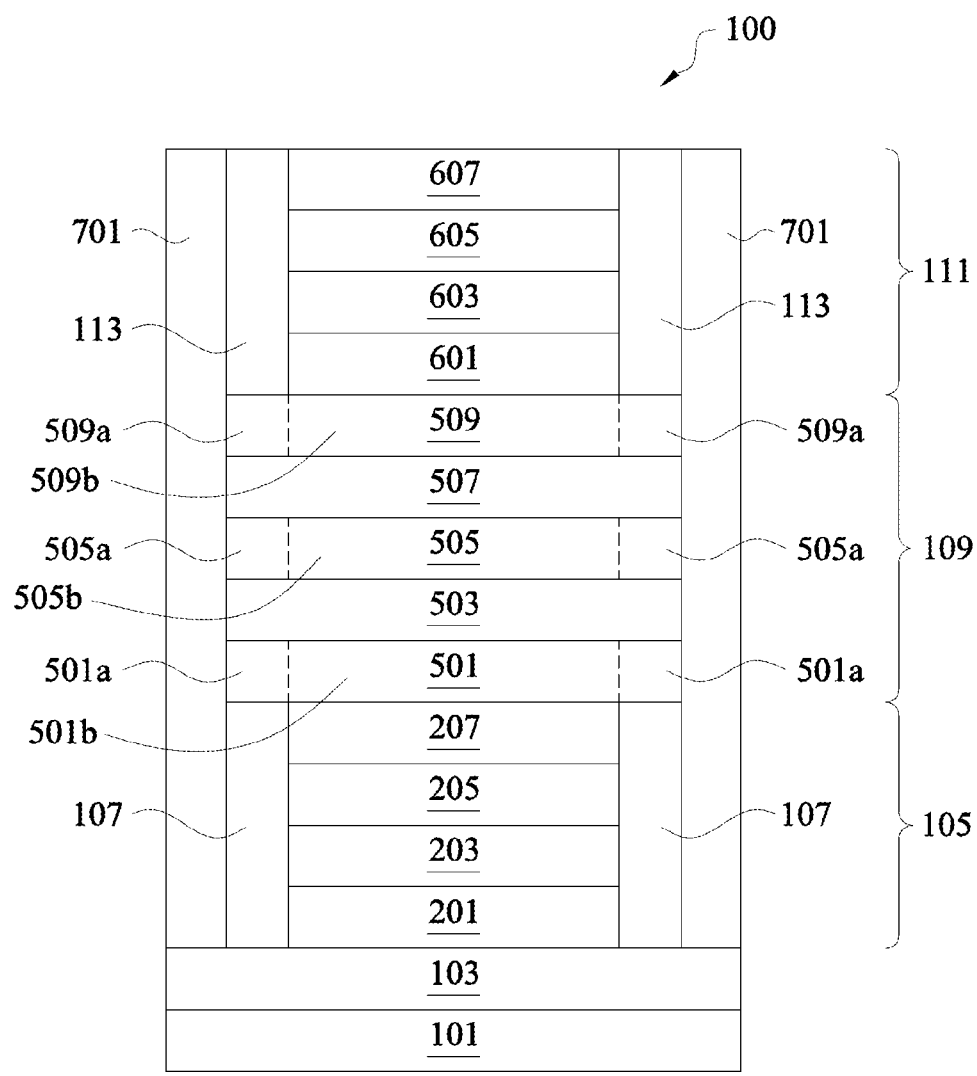
Figure 8A:
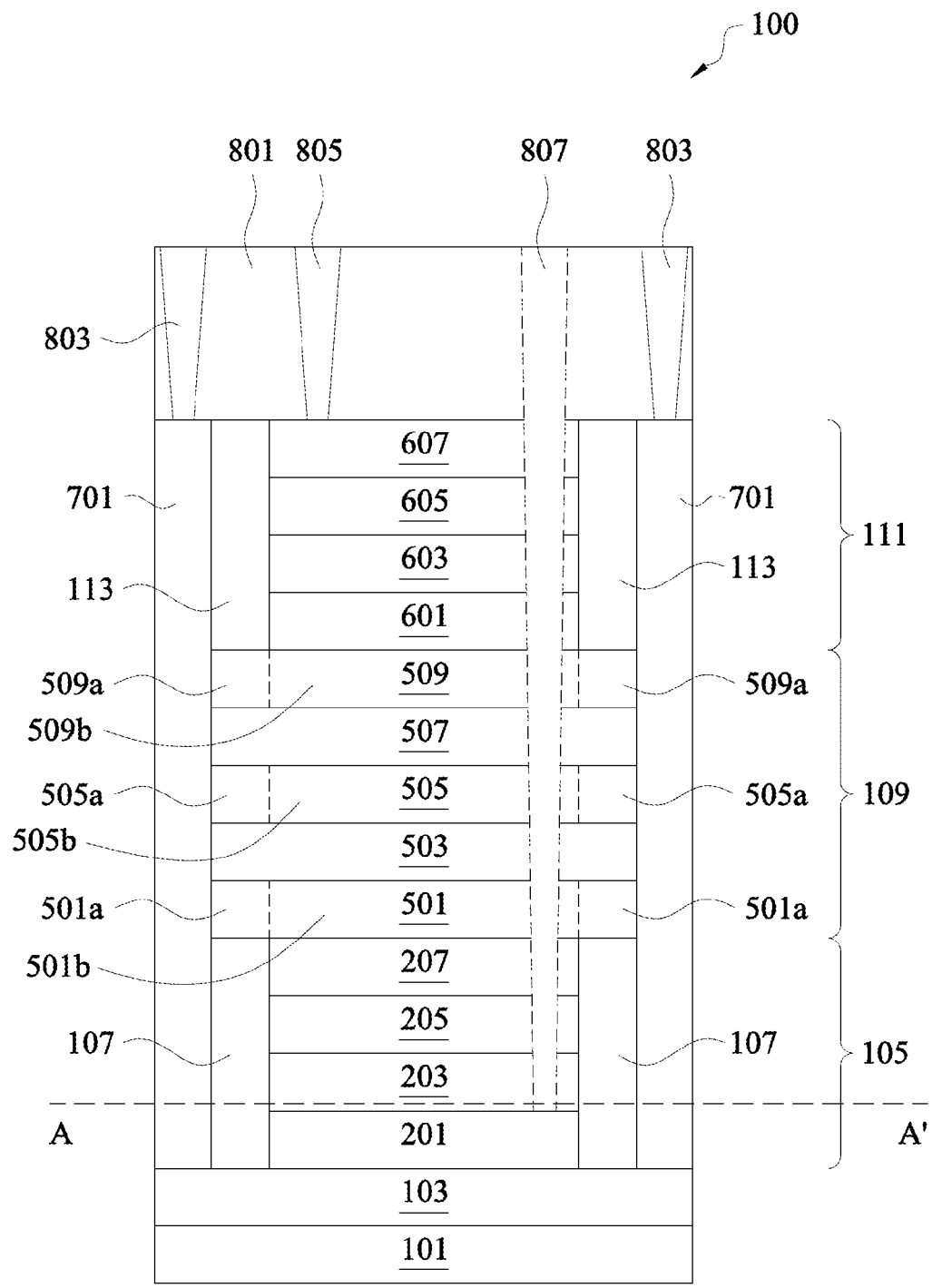

FIGS. 2-8A illustrate various cross-sectional views of a fabrication process of the semiconductor device 100 in accordance with some embodiments. In particular, FIGS. 2-4 illustrate formation of the first gate stack 105 and the first spacers 107 over the substrate 101. FIG. 5 illustrates formation of the source/channel/drain stack 109 over the first gate stack 105 and the first spacers 107. FIG. 6 illustrates formation of the second gate stack 111 and the second spacers 113 over the source/channel/drain stack 109. FIG. 7 illustrates formation of source/drain electrodes 701. FIG. 8A illustrates formation of conductive plugs 803, 805, and 807.

Referring first to FIG. 2, a portion of the substrate 101 is shown having a first dielectric layer 103 formed thereon. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like.

The first dielectric layer 103 is formed over the substrate 101. The first dielectric layer 103 may comprise an oxide or other dielectric material, for example. The first dielectric layer 103 may comprise, for example, $SiO_2$, $Al_2O_3$, or the like, and may be formed by, for example, chemical vapor deposition (CVD), plasma enhanced chemical vapor deposition (PECVD), atomic layer deposition (ALD), or the like. In some embodiments, the first dielectric layer 103 is configured to electrically isolate the semiconductor device 100 from other devices formed on the substrate 101.

In some embodiments, the substrate 101 is an SOI substrate and the first dielectric layer 103 is formed over a top semiconductor layer of the SOI substrate. In other embodiments, the substrate 101 is a bottom semiconductor layer of an SOI substrate and the first dielectric layer 103 is a buried oxide layer of the SOI substrate. In such embodiments, a top semiconductor layer of the SOI substrate is removed.

FIG. 2 further illustrates formation of a first conductive layer 201 on the first dielectric layer 103, a first ferroelectric layer 203 on the first conductive layer 201, a second conductive layer 205 on the first ferroelectric layer 203, and a second dielectric layer 207 on the second conductive layer 205. As described below in greater detail, the first conductive layer 201, the first ferroelectric layer 203, the second conductive layer 205, and the second dielectric layer 207 are subsequently patterned to form the first gate stack 105 as illustrated in FIG. 3.

In some embodiments, the first conductive layer 201 and the second conductive layer 205 may comprise a metallic material such as silver, aluminum, copper, tungsten, nickel, or alloys thereof, and may be formed using sputtering, physical vapor deposition (PVD), or the like.

In some embodiments, the first conductive layer 201 and the second conductive layer 205 include diffusion barrier layers (not shown) to protect neighboring layers form metal poisoning. For example, a first diffusion barrier layer (not shown) is interposed between the first conductive layer 201 and the first dielectric layer 103, a second diffusion barrier layer (not shown) is interposed between the first conductive layer 201 and the first ferroelectric layer 203, a third diffusion barrier layer (not shown) is interposed between the second conductive layer 205 and the first ferroelectric layer 203, and a fourth diffusion barrier layer (not shown) is interposed between the second conductive layer 205 and the second dielectric layer 207.

In some embodiments, diffusion barrier layers are metal-containing layers. Furthermore, diffusion barrier layers may have a resistivity much lower than the resistivity of the first dielectric layer 103, the second dielectric layer 207, and the first ferroelectric layer 203. For example, diffusion barrier layers may be conductive layers, although their conductivity may be relatively low. Exemplary materials for forming diffusion barrier layers include TiN, TaN, tungsten (W), platinum (Pt), or the like. In some embodiments, diffusion barrier layers are formed using PVD or the like.

FIG. 2 further illustrates formation of the first ferroelectric layer 203 over the first conductive layer 201. It is appreciated that the first ferroelectric layer 203, as-deposited without being annealed, may, or may not, have the ferroelectric property. However, it is still referred to as a ferroelectric layer since the ferroelectric property will be achieved in subsequent processes. The first ferroelectric layer 203 includes electric dipoles. In some embodiments, the first ferroelectric layer 203 has a thickness between about 0.1 μm and about 1 μm, such as about 0.9 μm. The exemplary materials of the first ferroelectric layer 203 include $HfO_2$, $HfSiO_x$, $HfZrO_x$, $Al_2O_3$, $TiO_2$, $LaO_x$, $BaSrTiO_x$ (BST), $PbZr_xTi_yO_z$ (PZT), or the like. The first ferroelectric layer 203 may be formed using sputtering, PVD, CVD, or the like.

It is appreciated that although some of the candidate materials (such as $HfO_2$, $HfSiO_x$, $HfZrO_x$, $Al_2O_3$, $TiO_2$, and $LaO_x$) of the first ferroelectric layer 203 include the same elements as some high-k dielectric materials, the first ferroelectric layer 203 has different properties than high-k dielectric materials. For example, the first ferroelectric layer 203 may have a resistivity lower than the respective high-k dielectric material that contains the same type of elements. The first ferroelectric layer 203 may still be a dielectric layer, except that if it is used as a gate dielectric, the leakage current will be high. Accordingly, the first ferroelectric layer 203 may not be suitable to be used as a gate dielectric even if it may also include the same elements as some known high-k dielectric materials.

In addition, the atomic percentages in the first ferroelectric layer 203 may be different from the respective high-k dielectric materials that include the same elements. Alternatively stated, the composition (reflecting the type of elements and the percentages of the elements) of the first ferroelectric layer 203 may be different from a high-k dielectric material even if they include the same elements. For example, $HfSiO_x$, when used as a high-k material, has a relatively low atomic percentage ratio $P_{Hf}/P_{Si}$, which may be smaller than about 10, wherein $P_{Hf}$ is the atomic percentage of hafnium, and $P_{Si}$ is the atomic percentage of silicon. When used to form the first ferroelectric layer 203, however, the $HfSiO_x$ is Hf rich and Si poor. For example, the atomic percentage ratio $P_{Hf}/P_{Si}$ in the respective ferroelectric $HfSiO_x$ may be increased to greater than about 10, and may be in the range between about 10 and about 100.

In addition, whether layer 203 will have the ferroelectric property or not is affected by various factors including, and not limited to, the elements contained, the percentage of the elements, and the phase of the resulting crystal structure. The phase is also affected by the deposition process conditions and post-treatment conditions for forming layer 203. Accordingly, even if a material has the same elements and same percentages of the elements as the first ferroelectric layer 203, this material is not necessarily a ferroelectric material. For example, the formation conditions and the subsequent annealing process can affect whether the ferroelectric property can be achieved or not.

In some embodiments, the first ferroelectric layer 203 has a crystalline structure, while the second dielectric layer 207 has an amorphous structure. In these embodiments, the first ferroelectric layer 203 and the second dielectric layer 207 may have a same composition (including same type of elements and same atomic percentages of the elements) or different compositions.

As further shown in FIG. 2, the second conductive layer 205 is formed over the first ferroelectric layer 203. In some embodiments, after forming the second conductive layer 205 an annealing is performed. In other embodiments, annealing may be performed at a later stage, such as after forming the source/channel/drain stack 109, after forming the second gate stack 111, or after completing formation of the semiconductor device 100. The annealing may result in layer 203 to have the ferroelectric property if the first ferroelectric layer 203 has not had the ferroelectric property yet. The annealing may be performed using thermal annealing, microwave annealing, laser annealing, or other applicable methods. The annealing duration may be shorter than about 1000 seconds. The annealing temperature may be higher than about 400° C., and may be as high as about 1000° C. or higher. The annealing duration and the annealing temperature are related to the composition of the first ferroelectric layer 203. For example, when PZT is used, the annealing temperature may be higher than about 200° C., or in the range between about 400° C. and about 600° C., and the annealing duration may be shorter than about 300 seconds.

In an embodiment wherein the annealing is performed after forming the second conductive layer 205, layers neighboring the first ferroelectric layer 203 (such as the first conductive layer 201, the second conductive layer 205, and the corresponding diffusion barrier layers) are configured to have melting temperatures higher than the annealing temperature to reduce and/or prevent melting during the annealing.

Referring further to FIG. 2, the second dielectric layer 207 is formed on the second conductive layer 205. In some embodiments, the second dielectric layer 207 is formed of a high-k dielectric material. Generally, a high-k dielectric material has a dielectric constant (k-value) higher than 3.9. In some exemplary embodiments, the k-value of the second dielectric layer 207 is higher than about 7, and may be higher than about 20. Exemplary high-k dielectric materials include $HfO_2$, $Al_2O_3$, $HfSiO_x$, $La_2O_3$, or the like. The second dielectric layer 207 may be formed using ALD, CVD, PECVD, or the like. In some embodiments, the second dielectric layer 111 has a thickness between about 0.5 nm and about 1 nm, such as about 0.5 nm.

Referring to FIG. 3, the first conductive layer 201, the first ferroelectric layer 203, the second conductive layer 205, and the second dielectric layer 207 are patterned to form the first gate stack 105. In the illustrated embodiment, the first gate stack 105 includes the first conductive layer 201, the first ferroelectric layer 203, the second conductive layer 205, and the second dielectric layer 207. Throughout the description, the first conductive layer 201 may also be referred as a first gate electrode 201, and the second dielectric layer 207 may also be referred as a first gate dielectric 207.

Referring further to FIG. 3, in the illustrated embodiment, the first gate electrode 201, the first ferroelectric layer 203, the second conductive layer 205 and the first gate dielectric 207 have the same width. However, a length of the first gate electrode 201 may formed to be larger than lengths of the first ferroelectric layer 203, the second conductive layer 205 and the first gate dielectric 207, such that a portion of the first gate electrode 201 remains exposed after forming the first gate stack 105. In some embodiments, forming the first gate electrode 201 with a larger length allows more flexibility for subsequent formation of a conductive plug that provides an electrical connection to the first gate electrode 201 and, therefore, to the first gate stack 105.

As discussed below in greater detail, a conductive plug (see FIGS. 8A-8C) is formed to contact the first gate electrode 201 to provide electrical connection to the first gate stack 105. Furthermore, the first ferroelectric layer 203 is configured to have a negative capacitance in order to reduce the subthreshold swing (SS) of the semiconductor device 100. In some embodiments, the second conductive layer 205 is a dummy layer in a sense that the conductive plug is not in direct electrical contact with the second conductive layer 205.

Referring to FIG. 4, the first spacers 107 are formed on sidewalls the first gate stack 105. In some embodiments, the first spacers 107 are formed of a dielectric material such as silicon oxide, silicon nitride, or the like. In some embodiments, a dielectric material of the first spacers 107 is blanket deposited over the first dielectric layer 103 and the first gate stack 105 using a suitable deposition method. Subsequently, horizontal portions of the dielectric layer are removed and vertical portions of the dielectric layer on the sidewalls of the first gate stack 105 form the first spacers 107. In some embodiments, horizontal portions of the dielectric layer are removed, for example, by an anisotropic etch process. In some embodiments, the first spacers 107 have a first width $W_1$ between about 10 nm and about 25 nm.

Referring further to FIG. 4, the first spacers 107 are formed along the left sidewall of the first gate stack 105 and along the right sidewall of the first gate stack 105. However, in some embodiments, the first spacers 107 are formed on all sidewalls of the first gate stack 105 (for example, see FIG. 8C) and may form a single spacer layer surrounding the first gate stack 105.

Referring to FIG. 5, a source/channel/drain stack 109 is formed over the first gate stack 105 and the first spacers 107. In the illustrated embodiment, the source/channel/drain stack 109 comprises a third dielectric layer 503 interposed between a first 2D material layer 501 and a second 2D material layer 505, and a fourth dielectric layer 507 interposed between the second 2D material layer 505 and a third 2D material layer 509. In the illustrated embodiment, the source/channel/drain stack 109 comprises three 2D material layers. However, in other embodiments, the source/channel/drain stack 109 may comprise more or less than three 2D material layers. As described below in greater detail, each 2D material layer is doped to define source/drain regions and a channel region in some embodiments.

In some embodiments, the third dielectric layer 503 and the fourth dielectric layer 507 are formed of same candidate materials and using similar methods as the first dielectric layer 103 and the second dielectric layer 207, and the description is not repeated herein. In some embodiments, the first 2D material layer 501, the second 2D material layer 505, and the third 2D material layer 509 may comprise one to a few monolayers of TMDCs, graphene, and boron nitride (BN). Generally, TMDCs are semiconductors of the chemical formula $MX_2$, with M a transition metal atom (such as, for example, Mo, W, and the like) and X a chalcogen atom (such as S, Se, Te). Examples of suitable TMDCs include $MoS_2$, $WS_2$, $WSe_2$, $MoSe_2$, $MoTe_2$, and the like. A monolayer of a TMDC material comprises one layer of M atoms sandwiched between two layers of X atoms. In an embodiment with a 2D material layer comprising a single $MoS_2$ monolayer, the 2D material layer has a thickness about 0.65 nm.

In some embodiments a 2D material layer is formed using, for example, CVD, atmospheric pressure CVD (APCVD), low-pressure CVD (LPCVD) at a sub-atmospheric pressure, PECVD, or combinations thereof. In some embodiments, a monolayer of a TMDC material such as $MoS_2$ may be formed using, for example, APCVD using precursors such as $MoO_3$ and S at a temperature of about 650° C. In other embodiments, other precursors and processes may be used.

Referring further to FIG. 5, in some embodiments, the first 2D material layer 501 is blanket deposited over the first dielectric layer 103, the first gate stack 105 and the first spacers 107, the third dielectric layer 503 is blanket deposited over the first 2D material layer 501, the second 2D material layer 505 is blanket deposited over the third dielectric layer 503, the fourth dielectric layer 507 is blanket deposited over the second 2D material layer 505, and the third 2D material layer 509 is blanket deposited over the fourth dielectric layer 507. Subsequently, the first 2D material layer 501, the third dielectric layer 503, the second 2D material layer 505, the fourth dielectric layer 507 and the third 2D material layer 509 are patterned to form the source/channel/drain stack 109. In some embodiments, the first 2D material layer 501, the third dielectric layer 503, the second 2D material layer 505, the fourth dielectric layer 507 and the third 2D material layer 509 are patterned using, for example, an anisotropic dry etch process, or the like. Furthermore, a length of the source/channel/drain stack 109 is similar to the lengths of the first ferroelectric layer 203, the second conductive layer 205 and the first gate dielectric 207, such that a portion of the first gate electrode 201 remains exposed after forming the source/channel/drain stack 109.

Referring further to FIG. 5, the first 2D material layer 501, the second 2D material layer 505, and the third 2D material layer 509 are doped to form first source/drain regions 501a, second source/drain regions 505a, and third source/drain regions 509a, respectively. Accordingly, portions of a 2D material layer interposed between source/drain regions form channel regions such as a first channel region 501b, a second channel region 505b, and a third channel region 509b.

In some embodiments, each of the 2D material layers (such as, for example, the first 2D material layer 501) is doped before forming a corresponding overlying dielectric layer (such as, for example, the third dielectric layer 503). In some embodiments, after blanket forming the first 2D material layer 501, a patterned mask (not shown) is deposited over the first 2D material layer 501. Portions of the first 2D material layer 501 exposed by the patterned mask is doped to form the first source/drain regions 501a. Subsequently, the patterned mask is removed using a suitable removal process. In an embodiment with the patterned mask formed of a photoresist material, the patterned mask is removed using, for example, an ashing process followed by a wet clean process. The second 2D material layer 505 and the third 2D material layer 509 are doped using methods similar to that used to dope the first 2D material layer 501, and the description is not repeated herein.

In embodiments in which a 2D material layer comprises a TMDC material such as $WSe_2$, source/drain regions are p-doped, for example, by $NO_2$ molecules, which are expected to be absorbed both physically and chemically on top of the $WSe_2$ surface. In some embodiments, the doping may be performed by exposing the 2D material layer to 0.05% $NO_2$ in $N_2$ gas for about 10 min. In embodiments in which a 2D material layer comprises a TMDC material such as $MoS_2$ or $WSe_2$, source/drain regions are n-doped, for example, by potassium (K) atoms. In some embodiments, the doping may be performed by exposing the 2D material layer to K vapor for about 1 min to about 120 mins.

Referring to FIG. 6, a second gate stack 111 is formed over the source/channel/drain stack 109. In the illustrated embodiment, the second gate stack 111 comprises layers similar to the first gate stack 105 but formed in a reverse order. In some embodiments, the second gate stack 111 comprises a fifth dielectric layer 601, a third conductive layer 603 over the fifth dielectric layer 601, a second ferroelectric layer 605 over the third conductive layer 603, and a fourth conductive layer 607 over the second ferroelectric layer 605. Various layers of the second gate stack 111 are formed of same candidate materials and using similar methods as corresponding layers of the first gate stack 105, and the description is not repeated herein.

In some embodiments, the fifth dielectric layer 601 is blanket deposited over the first dielectric layer 103 and the source/channel/drain stack 109, the third conductive layer 603 is blanket deposited over the fifth dielectric layer 601, the second ferroelectric layer 605 is blanket deposited over the third conductive layer 603, and the fourth conductive layer 607 is blanket deposited over the second ferroelectric layer 605. Subsequently, the fifth dielectric layer 601, the third conductive layer 603, the second ferroelectric layer 605, and the fourth conductive layer 607 is patterned to form the second gate stack 111. In some embodiments, the fifth dielectric layer 601, the third conductive layer 603, the second ferroelectric layer 605, and the fourth conductive layer 607 are patterned using, for example, an anisotropic dry etch process, or the like. Throughout the description, the fourth conductive layer 607 may be also referred as a second gate electrode 607, and the fifth dielectric layer 601 may be also referred as a second gate dielectric 601. Furthermore, a length of the second gate stack 111 is similar to the length of the source/channel/drain stack 109, such that a portion of the first gate electrode 201 remains exposed after forming the second gate stack 111.

As discussed below in greater detail, a conductive plug (see FIGS. 8A-8C) is formed to contact the second gate electrode 607 to provide an electrical connection to the second gate stack 111. Furthermore, the second ferroelectric layer 605 is configured to have a negative capacitance in order to reduce the subthreshold swing (SS) of the semiconductor device 100. In some embodiments, the third conductive layer 603 is a dummy layer in a sense that the conductive plug is not in direct electrical contact with the third conductive layer 603.

Referring further to FIG. 6, the second spacers 113 are formed on sidewalls of the second gate stack 111. In some embodiments, the second spacers 113 are formed of same candidate materials and using similar methods as the first spacers 107, and the description is not repeated herein. In some embodiments, the second spacers 113 have a second with $W_2$ between about 10 nm and about 25 nm.

Referring further to FIG. 6, the second spacers 113 are formed along the left sidewall of the second gate stack 111 and along the right sidewall of the second gate stack 111.

However, in some embodiments, the second spacers 113 are formed on all sidewalls of the second gate stack 111 and may form a single spacer layer surrounding the second gate stack 111.

Referring to FIG. 7, the source/drain electrodes 701 are formed to contact the first source/drain regions 501a, the second source/drain regions 505a and the third source/drain regions 509a of the source/channel/drain stack 109. In some embodiments, the source/drain electrodes 701 may comprise a metallic material such as silver, aluminum, copper, tungsten, nickel, or alloys thereof. In some embodiments, the source/drain electrodes 701 are formed by combination of lithography, metal evaporation and lift-off processes.

In some embodiments, a sacrificial layer (not shown) is formed over the semiconductor device 100. The sacrificial layer is subsequently patterned to form openings in the sacrificial layer. In some embodiments wherein the sacrificial layer is formed of a photoresist material, the openings are formed using photolithography techniques. Generally, photolithography techniques involve depositing a photoresist material, which is subsequently irradiated (exposed) and developed to remove a portion of the photoresist material to form the openings. The remaining photoresist material protects the underlying material from subsequent processing steps.

In some embodiments, a metallic material such as silver, aluminum, copper, tungsten, nickel, or alloys thereof, is deposited over the sacrificial layer and in the openings. Subsequently, the sacrificial layer is removed (for example, a photoresist material using a suitable solvent). Accordingly, the metallic material on top of the sacrificial layer is lifted-off and removed together with the sacrificial layer. After the lift-off process, the metallic material remains only in the regions unprotected by the sacrificial layer.

Referring to FIG. 8A, an interlayer dielectric (ILD) layer 801 is formed over the semiconductor device 100. In some embodiments, the ILD layer 801 is formed of one or more layers of dielectric material, such as silicon oxide, low-k dielectrics or other suitable materials, by a suitable technique, such as CVD, ALD, spin-on, or the like. A chemical mechanical polishing (CMP) process may be performed to remove excessive dielectric material from the ILD layer.

Subsequently, conductive plugs are formed to provide electrical connections to the source/drain electrodes 701, the first gate electrode 201, and the second gate electrode 607. In the illustrated embodiment, the first conductive plugs 803 provide electrical connections to the source/drain electrodes 701, the second conductive plug 805 provides electrical connection to the second gate electrode 607, and the third conductive plug 807 provides electrical connection to the first gate electrode 201.

The ILD layer 801 may be patterned using photolithography techniques to form openings in the ILD layer 801 and expose the source/drain electrodes 701, the second gate electrode 607 and the first gate electrode 201. The first conductive plugs 803, the second conductive plug 805, and the third conductive plug 807 are formed by depositing a suitable conductive material in the openings using various deposition and plating methods. The material of the conductive plugs may comprise copper, a copper alloy, silver, gold, tungsten, tantalum, aluminum, and the like.

In addition, the first conductive plugs 803, the second conductive plug 805, and the third conductive plug 807 may include one or more barrier/adhesion layers (not shown) to protect, for example, the ILD layer 801 from diffusion and metallic poisoning. The barrier layer may comprise titanium, titanium nitride, tantalum, tantalum nitride, or other alternatives. The barrier layer may be formed using PVD, CVD, or the like. In some embodiments, a CMP process is performed to remove excess barrier layer and the conductive material such that the topmost surfaces of the first conductive plugs 803, the second conductive plug 805, and the third conductive plug 807 are substantially coplanar with the topmost surface of the ILD layer 801.

Referring further to FIG. 8A, sidewalls of the third conductive plug 807 are depicted using dashed lines to indicate that the third conductive plug 807 is not formed in the plane of the cross section shown in FIG. 8A (see FIGS. 8B and 8C) and, in an embodiment, the third conductive plug 807 does not extend through the layers of the second gate stack 111, the source/channel/drain stack 109 and the first gate stack 105 to contact the first gate electrode 201. In the illustrated embodiment, the third conductive plug 807 extends through the ILD layer 801 to contact the first gate electrode 201.

Figure 8B:
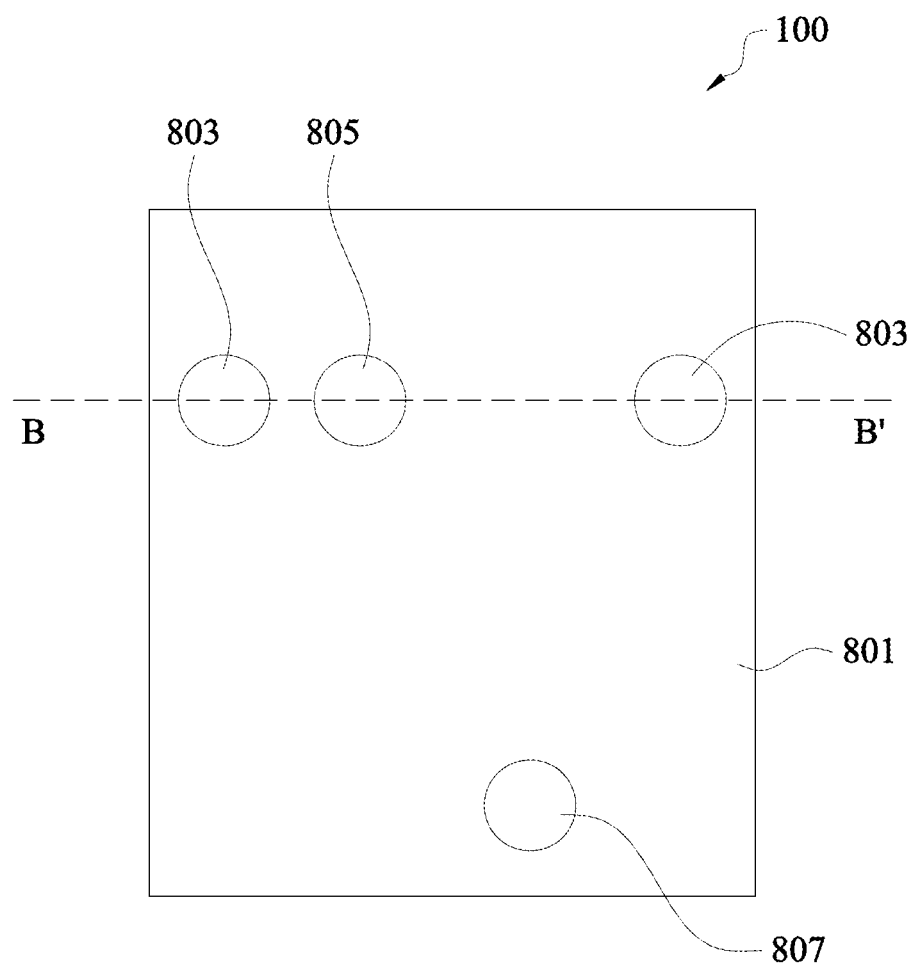
FIG. 8B illustrates a top view of the semiconductor device of FIG. 8A in accordance with some embodiments.

FIG. 8B illustrates a top view of the semiconductor device 100 of FIG. 8A in accordance with some embodiments. A line BB' indicates the plane of the cross section shown in FIG. 8A. In the illustrated embodiment, and the first conductive plugs 803, the second conductive plug 805 and the third conductive plug 807 have circular shapes as viewed from top. In other embodiments, the first conductive plugs 803, the second conductive plug 805 and the third conductive plug 807 may have various shapes such as oval shapes, square shapes, rectangular shapes, polygonal shapes, or the like.

Figure 8C:
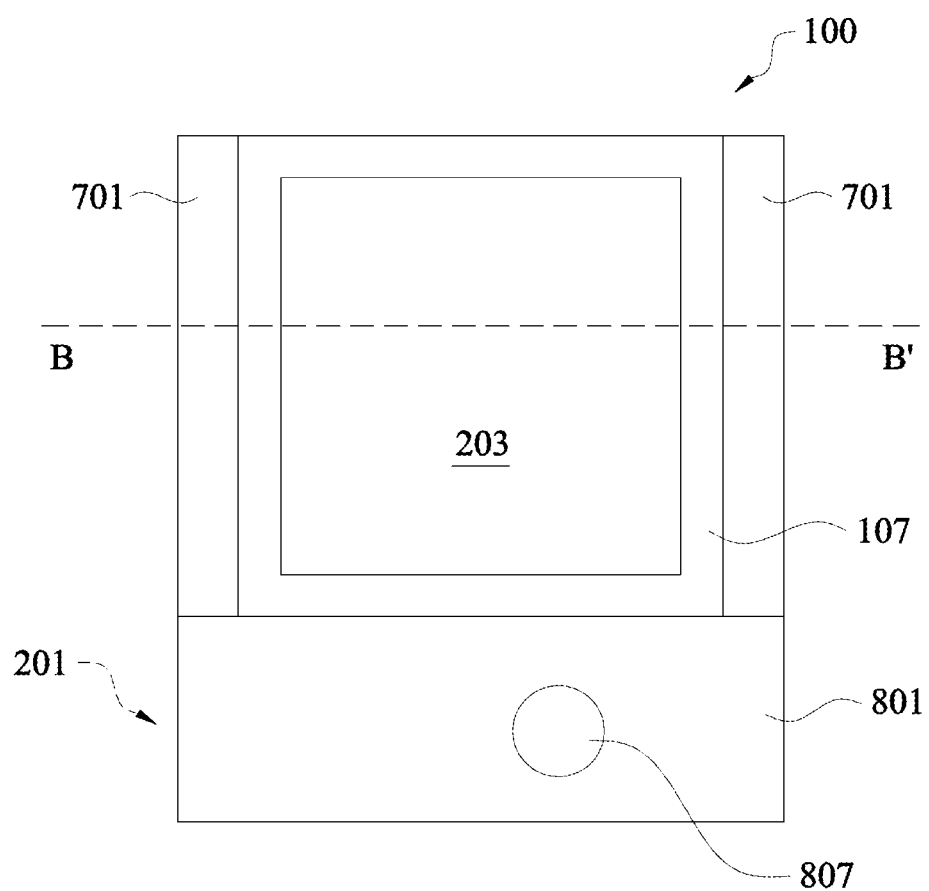
FIG. 8C illustrates a planar view of the semiconductor device of FIG. 8A (along a line AA') in accordance with some embodiments.

FIG. 8C illustrates a planar view of the semiconductor device 100 of FIG. 8A (along a line AA') in accordance with some embodiments. In the illustrated embodiment, the first gate electrode 201 of the first gate stack 105 (see FIG. 8A) extends below the ILD layer 801 and contacts the third conductive plug 807 as the third conductive plug 807 extends through the ILD layer 801.

In some embodiments, further manufacturing steps may be performed on the semiconductor device 100. For example, metallization layers (not shown) may be formed over the semiconductor device 100. The metallization layers may comprise one or more dielectric layers and conductive features formed in the one or more dielectric layers. In some embodiments, the metallization layers are in electrical contact with the first conductive plugs 803, the second conductive plug 805 and the third conductive plug 807 and electrically interconnect the semiconductor device 100 to other devices formed on the substrate 101.

Figure 9:
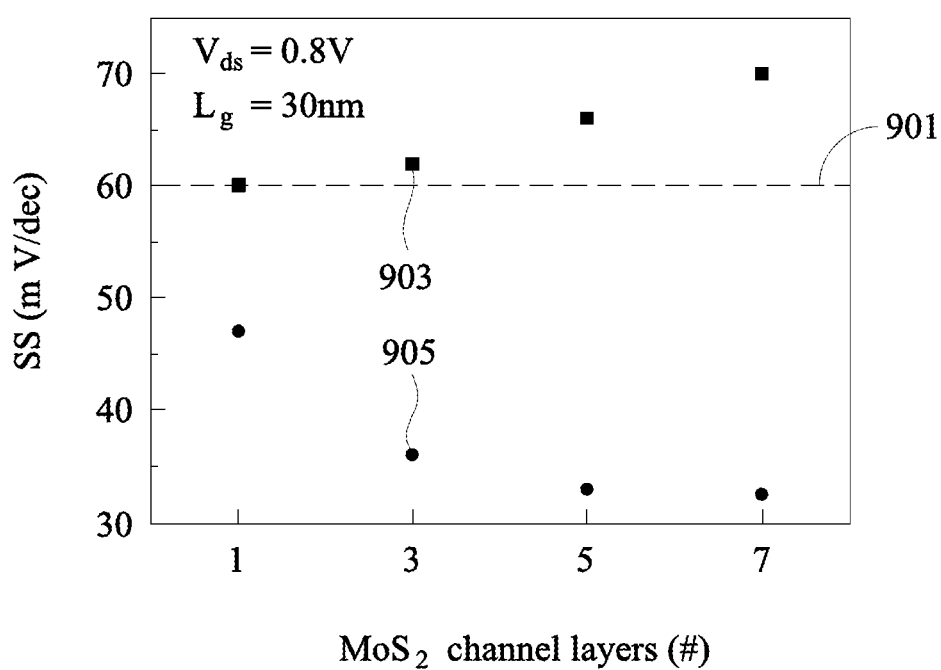
FIG. 9 is a diagram illustrating a dependence of a subthreshold swing on a number of 2D material layers for various semiconductor devices in accordance with some embodiments.

FIG. 9 is a diagram illustrating a dependence of a sub-threshold swing (SS) on a number of 2D material layers for various semiconductor devices in accordance with some embodiments. In the illustrated embodiment, FET devices having source/channel/drain stacks comprising one, three, five, and seven monolayers of $MoS_2$ are shown. Square labels 903 show the SS for conventional FET devices having gate stacks without ferroelectric layers. Circular labels 905 show the SS for FET devices having gate stacks with ferroelectric layers, such as the semiconductor device 100 shown in FIG. 8A. In the illustrated embodiment, the ferroelectric layers are formed of $PbZr_{0.7}Ti_{0.3}O_3$. Furthermore, all FET devices shown in FIG. 9 have gate stacks of a length $L_g$ about 30 nm and are biased by a source-drain voltage $V_{ds}$ about 0.8V.

Referring further to FIG. 9, the SS for the conventional FET devices (square labels 903) is larger than the theoretical minimum of about 60 mV/dec (at room temperature), illustrated by a dashed line 901. Furthermore, the SS increase as the number of 2D material layers increases. Accordingly, having large number of 2D material layers may not be beneficial for device performance, such as, for example, a switching speed.

For FET devices, such as the semiconductor device 100 shown in FIG. 8A, the SS (circular labels 905) is lower than the theoretical minimum 60 mV/dec represented by the dashed line 901. For a FET device, such as the semiconductor device 100, the SS is proportional to $(1+C_0/C_{FE})$, wherein $C_{FE}$ is a capacitance of a ferroelectric layer (such as the first ferroelectric layer 203 and the second ferroelectric layer 605) and $C_0$ is an equivalent capacitance of the FET device without the ferroelectric layer (a conventional FET device). In some embodiments, $C_{FE}$ is less than 0, $C_0$ is larger than 0 and, therefore, $(1+C_0/C_{FE})$ is less than 1. Accordingly, the SS value of the FET device is reduced due to the existence negative capacitance $C_{FE}$ of the ferroelectric layer. Furthermore, the SS decreases as the number of 2D material layers increases, and reaches saturation at about five monolayers of $MoS_2$. Accordingly, having more than one 2D material layers may be beneficial for device performance, such as, for example, a switching speed.

Figure 10:
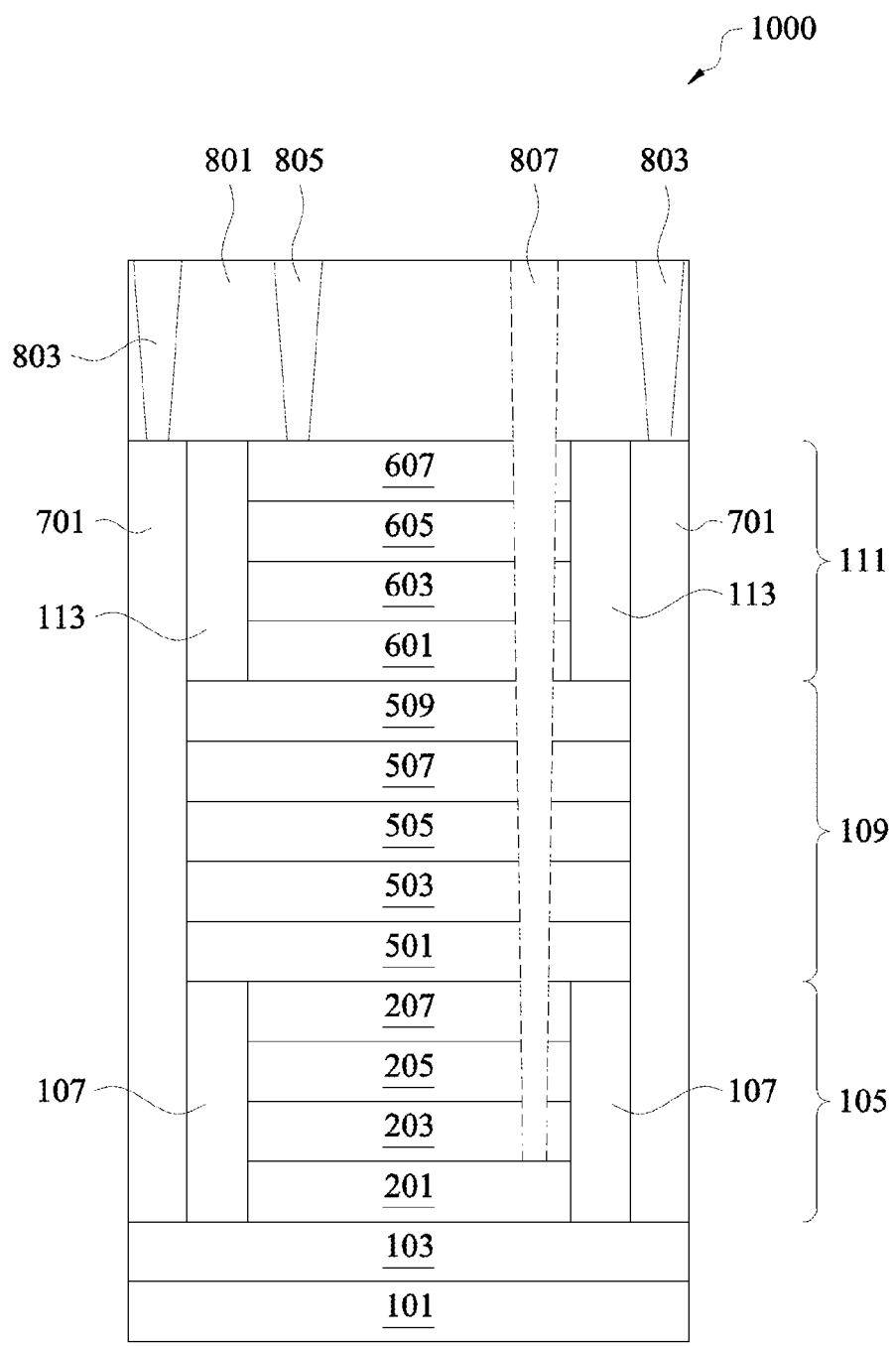
FIG. 10 illustrates a cross-sectional view of a semiconductor device in accordance with some alternative embodiments.

FIG. 10 illustrates a cross-sectional view of a semiconductor device 1000 in accordance with some alternative embodiments. In some embodiments, the semiconductor device 1000 is similar to the semiconductor device 100 illustrated in FIG. 8A and may be formed using a method similar to a method described above with reference to FIGS. 2-8C and the detailed description is not repeated herein. In the embodiment illustrated in FIG. 10, the first 2D material layer 501, the second 2D material layer 505 and the third 2D material layer 509 of the semiconductor device 1000 are not doped while forming the source/channel/drain stack 109.

Figure 11:
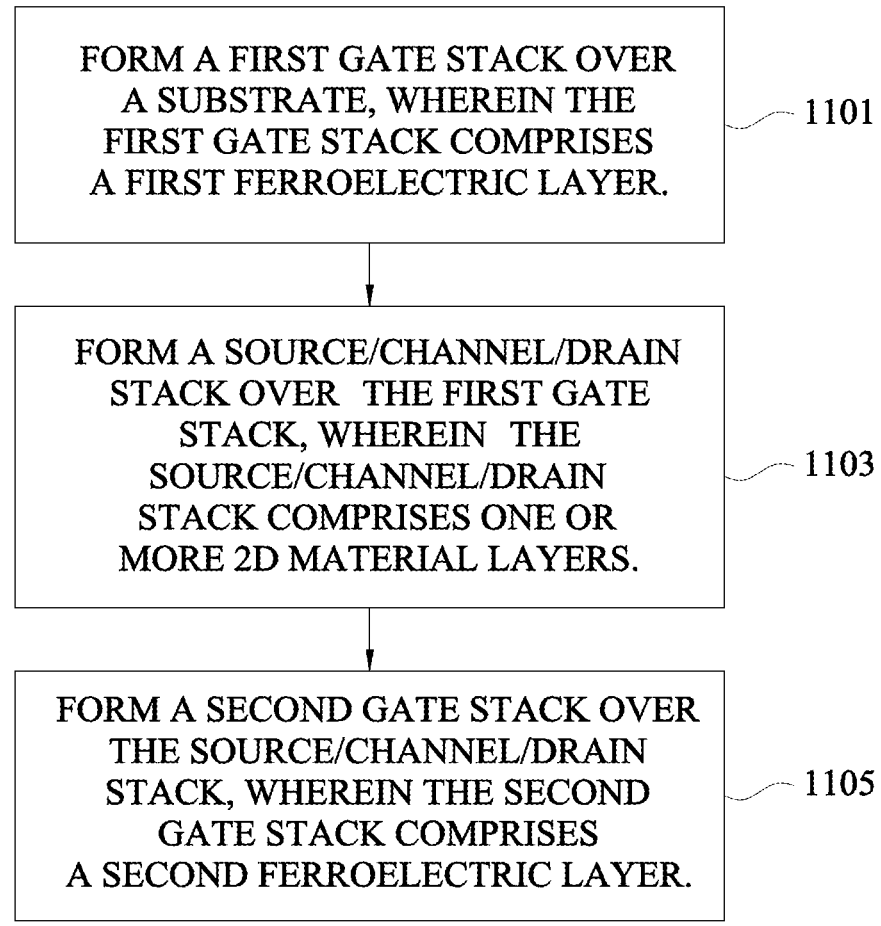
FIG. 11 is a flow diagram illustrating a method of forming a semiconductor device in accordance with some embodiments.

FIG. 11 is a flow diagram illustrating a method of forming a semiconductor device in accordance with some embodiments. The method starts at step 1101, wherein a first gate stack (such as the first gate stack 105) is formed over a substrate as described above with reference to FIGS. 2-3. In some embodiments, a stack of layers comprising a first metal layer, a first ferroelectric layer on the first metal layer, a second metal layer on first ferroelectric layer, and a first dielectric layer on the second metal layer is formed over the substrate as described above with reference to FIG. 2. Subsequently, the stack of layers is patterned to form the first gate stack as described above with reference to FIG. 3. In some embodiments, first spacers (such as the first spacers 107) are formed on the sidewalls of the first gate stack as described above with reference to FIG. 4.

During step 1103, a source/channel/drain stack (such as the source/channel/drain stack 109) is formed over the first gate stack. In some embodiments, the source/channel/drain stack comprises one or more 2D material layers (such as, for example, the first 2D material layer 501) as described above with reference to FIG. 5. In some embodiments, each 2D material layer is doped to form source/drain regions, wherein an undoped region of the 2D material layer interposed between a first source/drain region and a second source/drain region forms a channel region as described above with reference to FIG. 5. In other embodiments, the source/channel/drain stack comprises one or more undoped 2D material layers as described above with reference to FIG. 10.

Finally, during step 1105, a second gate stack (such as the second gate stack 111) is formed over the source/channel/drain stack as described above with reference to FIG. 6. In some embodiments, a stack of layers comprising a second dielectric layer, a third metal layer on the second dielectric layer, a second ferroelectric layer on the third metal layer, and a fourth metal layer on the second ferroelectric layer is formed over the source/channel/drain stack as described above with reference to FIG. 6. Subsequently, the stack of layers is patterned to form the second gate stack as described above with reference to FIG. 6. In some embodiments, second spacers (such as the second spacers 113) are formed on the sidewalls of the second gate stack as described above with reference to FIG. 6.

The embodiments of the present disclosure have some advantageous features. For example, by adopting a ferroelectric layer in the gate stack, the SS value of the resulting FET is reduced. Moreover, by adopting multiple layers of 2D materials to form channel regions, a FET device having large on current can be formed, without sacrificing a footprint of the FET device. In addition, by forming multiple gate stacks, a FET device with improved gate control can be formed.

According to an embodiment, a semiconductor device comprises a substrate, a first gate stack over the substrate, wherein the first gate stack comprises a first ferroelectric layer. The semiconductor device further comprises a source/channel/drain stack over the first gate stack, wherein the source/channel/drain stack comprises one or more 2D material layers, and a second gate stack over the source/channel/drain stack, wherein the second gate stack comprises a second ferroelectric layer.

According to another embodiment, a semiconductor device comprises a first ferroelectric layer over a substrate, a first metal layer over the first ferroelectric layer, and a first dielectric layer over the first metal layer. The semiconductor device further comprises 2D material layers over the first dielectric layer, wherein neighboring 2D material layers are separated by a corresponding dielectric layer. The semiconductor device further comprises a second dielectric layer over the 2D material layers, a second metal layer over the second dielectric layer, and a second ferroelectric layer over the second metal layer.

According to yet another embodiment, a method of forming a semiconductor device, the method comprises forming a first gate stack over a substrate, wherein the first gate stack comprises a first ferroelectric layer. The method further comprises forming a source/channel/drain stack over the first gate stack, wherein the source/channel/drain stack comprises one or more 2D material layers, and forming a second gate stack over source/channel/drain stack, wherein the second gate stack comprises a second ferroelectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device comprising:
   a substrate;
   a first gate stack over the substrate, wherein the first gate stack comprises a first ferroelectric layer;
   a source/channel/drain stack over the first gate stack, wherein the source/channel/drain stack comprises one or more solid 2D material layers; and a second gate stack over the source/channel/drain stack, wherein the second gate stack comprises a second ferroelectric layer, and wherein at least a portion of the first gate stack laterally extends beyond an edge of the second gate stack.

2. The semiconductor device of claim 1, wherein the substrate is a silicon-on-insulator substrate, the first gate stack being formed on a buried oxide layer of the silicon-on-insulator substrate.

3. The semiconductor device of claim 1, wherein the first gate stack further comprises a first dielectric layer and a first conductive layer, the first conductive layer being interposed between the first dielectric layer and the first ferroelectric layer.

4. The semiconductor device of claim 1, wherein the second gate stack further comprises a second dielectric layer and a second conductive layer, the second conductive layer being interposed between the second dielectric layer and the second ferroelectric layer.

5. The semiconductor device of claim 1, wherein each of the one or more solid 2D material layers comprises a transition metal dichalcogenide, graphene, or boron nitride.

6. The semiconductor device of claim 1, wherein the first ferroelectric layer and the second ferroelectric layer are formed of $HfO_2$, $HfSiO_x$, $HfZrO_x$, $Al_2O_3$, $TiO_2$, $LaO_x$, $BaSrTiO_x$, or $PbZr_xTi_yO_z$.

7. The semiconductor device of claim 1, wherein each of the one or more solid 2D material layers comprises a first source/drain region, a second source/drain region, and a channel region interposed between the first source/drain region and the second source/drain region.

8. The semiconductor device of claim 1, further comprising a first spacer along a sidewall of the first gate stack and a second spacer along a sidewall of the second gate stack, wherein source/drain regions of the source/channel/drain stack are interposed between the first spacer and the second spacer.

9. A semiconductor device comprising:
a first ferroelectric layer over a substrate;
a first metal layer over the first ferroelectric layer;
a first dielectric layer over the first metal layer;
2D material layers over the first dielectric layer, wherein neighboring 2D material layers are separated by a corresponding dielectric layer;
a second dielectric layer over the 2D material layers;
a second metal layer over the second dielectric layer;
a second ferroelectric layer over the second metal layer; and
a spacer adjacent to the first ferroelectric layer, wherein the 2D material layers extend over the spacer, and wherein at least one of the 2D material layers physically contacts the spacer.

10. The semiconductor device of claim 9, further comprising a third metal layer, wherein the first ferroelectric layer is interposed between the first metal layer and the third metal layer.

11. The semiconductor device of claim 10, wherein the third metal layer is wider than the first metal layer.

12. The semiconductor device of claim 10, further comprising a conductive plug in electrical contact with the third metal layer.

13. The semiconductor device of claim 9, further comprising a fourth metal layer, wherein the second ferroelectric layer is interposed between the second metal layer and the fourth metal layer.

14. The semiconductor device of claim 9, further comprising a first source/drain electrode and a second source/drain electrode adjacent the 2D material layers, wherein the 2D material layers are interposed between the first source/drain electrode and the second source/drain electrode.

15. A method of forming a semiconductor device, the method comprising:
forming a first gate stack over a substrate, wherein the first gate stack comprises a first ferroelectric layer;
forming a first spacer along a sidewall of the first gate stack;
forming a source/channel/drain stack over the first gate stack, wherein the source/channel/drain stack comprises one or more 2D material layers, and wherein a portion of the one or more 2D material layers extends directly over the first spacer; and
forming a second gate stack over source/channel/drain stack, wherein the second gate stack comprises a second ferroelectric layer.

16. The method of claim 15, wherein the forming the first gate stack further comprises forming a first conductive layer and a second conductive layer, the first ferroelectric layer being interposed between the first conductive layer and the second conductive layer.

17. The method of claim 15, wherein the forming the second gate stack further comprises forming a third conductive layer and a fourth conductive layer, the second ferroelectric layer being interposed between the third conductive layer and the fourth conductive layer.

18. The method of claim 15, further comprising forming a first source/drain electrode and a second source/drain electrode, wherein the source/channel/drain stack over is interposed between the first source/drain electrode and the second source/drain electrode.

19. The method of claim 15, further comprising forming a first conductive plug in electrical contact with a first conductive layer below the first ferroelectric layer and a second conductive plug in electrical contact with a second conductive layer above the second ferroelectric layer.

20. The method of claim 15, further comprising forming a second spacer along a sidewall of the second gate stack, the portion of the one or more 2D material layers being interposed between the first spacer and the second spacer.

* * * * *